(12) United States Patent
Kurosawa et al.

(10) Patent No.: US 7,655,900 B2
(45) Date of Patent: Feb. 2, 2010

(54) INTENSITY MODULATION TYPE OPTICAL SENSOR AND OPTICAL CURRENT/VOLTAGE SENSOR

(75) Inventors: Kiyoshi Kurosawa, Tokyo (JP); Kazuomi Shirakawa, Tokyo (JP)

(73) Assignee: The Tokyo Electric Power Company, Incorporated, Tokyo (JP)

( * ) Notice: Subject to any disclaimer, the term of this patent is extended or adjusted under 35 U.S.C. 154(b) by 0 days.

(21) Appl. No.: 11/817,955

(22) PCT Filed: Mar. 1, 2006

(86) PCT No.: PCT/JP2006/303871

§ 371 (c)(1),
(2), (4) Date: Nov. 6, 2008

(87) PCT Pub. No.: WO2006/095619

PCT Pub. Date: Sep. 14, 2006

(65) Prior Publication Data

US 2009/0090842 A1    Apr. 9, 2009

(30) Foreign Application Priority Data

Mar. 8, 2005   (JP) .............................. 2005-063608

(51) Int. Cl.
  *G01R 15/24*   (2006.01)
  *G01R 19/00*   (2006.01)
  *G01R 33/032*  (2006.01)

(52) U.S. Cl. .......................... 250/227.14; 250/227.17; 250/227.21; 324/96; 356/365

(58) Field of Classification Search ............. 250/227.14, 250/227.17, 227.18, 227.21; 356/364, 483, 356/365; 234/96, 117 R
See application file for complete search history.

(56) References Cited

U.S. PATENT DOCUMENTS 3,629,703 A  *  12/1971  Bernard ....................... 324/96

(Continued)

FOREIGN PATENT DOCUMENTS

JP          58-139082 A        8/1983

(Continued)

OTHER PUBLICATIONS

International Search Report by Japanese Patent Office dated May 23, 2006.

(Continued)

*Primary Examiner*—John R Lee
(74) *Attorney, Agent, or Firm*—Knobbe Martens Olson & Bear LLP

(57)    ABSTRACT

An influence on a sensor output is suppressed to a minimum degree even in the case when there is a ripple in a light source, thereby improving the measurement accuracy. In an intensity modulation type optical sensor, light from a light source 1 is guided to a sensor head 6, the intensity of the light is modulated on the basis of an alternating current (AC) measured object (for example, a current i) changing with time, the modulated light is received in a light receiving element 81 and converted into an electrical signal, and a normalized received signal Xs indicating a degree of modulation is acquired from a ratio of an AC component As and a DC component Ds of the electrical signal to thereby acquiring a value of the AC measured object. Further in this invention, a reference signal Vr is acquired by separating and receiving part of light incident on the sensor head 6, a normalized reference signal Xr is acquired from a ratio of an AC component Ar and a DC component Dr of the reference signal, and the normalized reference signal Xr is subtracted from the normalized received signal Xs, thereby reducing noises and improving the accuracy.

3 Claims, 5 Drawing Sheets

U.S. PATENT DOCUMENTS

| | | | |
|---|---|---|---|
| 3,707,329 A * | 12/1972 | Jaecklin et al. | 356/368 |
| 4,112,367 A * | 9/1978 | Hepner et al. | 324/244.1 |
| 4,564,754 A * | 1/1986 | Sato et al. | 250/225 |
| 4,694,243 A * | 9/1987 | Miller et al. | 324/96 |
| 4,725,140 A * | 2/1988 | Musha | 356/336 |
| 4,797,607 A * | 1/1989 | Dupraz | 324/96 |
| 4,916,387 A * | 4/1990 | Miller | 324/96 |
| 5,063,290 A * | 11/1991 | Kersey | 250/227.17 |
| 5,125,744 A * | 6/1992 | Watanabe | 356/625 |
| 5,136,235 A * | 8/1992 | Brandle et al. | 324/96 |
| 5,363,363 A * | 11/1994 | Gage | 369/116 |
| 5,491,682 A * | 2/1996 | Dohmeier et al. | 369/124.12 |
| 5,656,934 A * | 8/1997 | Bosselmann | 324/96 |
| 5,764,046 A * | 6/1998 | Bosselmann | 324/96 |
| 5,811,964 A * | 9/1998 | Bosselmann et al. | 324/96 |
| 5,834,933 A * | 11/1998 | Meier | 324/117 R |
| 5,847,560 A * | 12/1998 | Bosselmann et al. | 324/96 |
| 5,895,912 A * | 4/1999 | Bosselmann et al. | 250/227.17 |
| 6,114,846 A * | 9/2000 | Bosselmann et al. | 324/96 |
| 6,122,415 A * | 9/2000 | Blake | 385/12 |
| 6,140,634 A * | 10/2000 | Bosselmann | 250/225 |
| 6,154,022 A * | 11/2000 | Willsch et al. | 324/96 |
| 6,208,129 B1 * | 3/2001 | Willsch et al. | 324/96 |
| 6,417,660 B2 * | 7/2002 | Menke | 324/96 |
| 6,479,979 B1 * | 11/2002 | Kingsley et al. | 324/96 |
| 6,495,999 B1 * | 12/2002 | Beierl et al. | 324/96 |
| 6,504,355 B2 * | 1/2003 | Minier | 324/96 |
| 6,563,589 B1 * | 5/2003 | Bennett et al. | 356/483 |
| 6,618,153 B2 * | 9/2003 | Lin et al. | 356/483 |
| 6,630,819 B2 * | 10/2003 | Lanagan et al. | 324/76.36 |
| 6,724,179 B2 * | 4/2004 | Kingsley et al. | 324/96 |
| 6,946,827 B2 * | 9/2005 | Rahmatian et al. | 324/96 |
| 6,952,107 B2 * | 10/2005 | Rahmatian | 324/753 |
| 2002/0000801 A1 * | 1/2002 | Menke | 324/96 |
| 2002/0011831 A1 * | 1/2002 | Minier | 324/96 |
| 2002/0145414 A1 * | 10/2002 | Lanagan et al. | 324/76.11 |
| 2003/0042884 A1 * | 3/2003 | Kingsley et al. | 324/96 |
| 2003/0117125 A1 * | 6/2003 | Rahmatian et al. | 324/96 |
| 2003/0117126 A1 * | 6/2003 | Rahmatian | 324/96 |
| 2009/0090842 A1 * | 4/2009 | Kurosawa et al. | 250/205 |

FOREIGN PATENT DOCUMENTS

| | | |
|---|---|---|
| JP | 59-061783 A | 4/1984 |
| JP | 64-088373 | 4/1989 |
| JP | 3-282383 A | 12/1991 |
| JP | 11-264766 A | 9/1999 |
| JP | 2000-266787 A | 9/2000 |

OTHER PUBLICATIONS

Technical data on optical fiber sensor: revised edition, edited by Toshihiko Yoshino, 1986, pp. 404-405.

Kiyoshi Kurosawa, "Development of Optical Fiber Current Sensors and Their Applications", Journal of the Institute of Electrostatics Japan, vol. 28 No. 5, 2004, pp. 251-257.

M. Takahashi et al. "Sagnac Interferometer-type fiber-optic current sensor using single-mode fiber down leads", Technical Digest of 16$^{th}$ International conference on optical fiber sensor, 2003, pp. 756-759.

Kiyoshi Kurosawa, "Investigation on Basic Characteristics of Optical Current Transducer Applying Optical Heterodyning Technique", The institute of Electrical Engineers of Japan, Transactions on Power and Energy, vol. B 117, No. 3, 1997, pp. 354-363.

* cited by examiner

MEASURED CURRENT Y

RECEIVED SIGNAL As

Y

REFERENCE SIGNAL Ar

Y

OUTPUT SIGNAL Sout
(NOISES ARE REMOVED)

INTENSITY MODULATION TYPE OPTICAL SENSOR AND OPTICAL CURRENT/VOLTAGE SENSOR

RELATED APPLICATIONS

This application relates to U.S. patent application Ser. No. 11/817,958 filed on Sep. 6, 2007 and entitled "OPTICAL SENSOR, OPTICAL CURRENT SENSOR AND OPTICAL VOLTAGE SENSOR."

TECHNICAL FIELD

The present invention relates to an intensity modulation type optical sensor, and in particular, an intensity modulation type optical current/voltage sensor capable of reducing noise.

BACKGROUND ART

As an optical sensor with high precision, for example, there is a so-called optical heterodyne sensor (for example, refer to Non-patent Document 1) in which interference occurring when mixing signal light modulated by a measured object with a local oscillation signal having a different frequency from the signal light is received and detected in a photoelectric detector. However, due to the complicated structure, a current detection sensor that is based on a principle of modulation of light intensity using the Faraday effect and a voltage detection sensor that is based on a principle of modulation of light intensity using the Pockels effect are recently being developed for practical use.

The basic operation of the optical intensity modulation type sensors is as follows.

a) The intensity of light transmitted from a light source to a sensor head is modulated by a measured object.

b) The light whose intensity has been modulated is transmitted to a light receiving element and is converted into an electrical signal proportional to the amount of light in the received signal.

c) A change in the amount of received light is acquired from a change in a value of the electrical signal, such that the size of the measured object is known.

In such an optical intensity modulation type sensor, it is an important issue in securing the measurement accuracy to inhibit a change in the amount of light in the received signal, which occurs due to factors other than the measured object, from affecting a sensor output.

Causes of fluctuation in the amount of light may be attributed to fluctuation in the light source intensity, a fluctuation in the transmission efficiency of a transmission line used to transmit light to a sensor head, and fluctuation in the transmission efficiency of a transmission line from the sensor head to a light receiving element. In addition, each fluctuation in the amount of light may be divided into a drift fluctuation and a relatively high-speed fluctuation.

In order to inhibit the fluctuation in the amount of light from affecting the output, the following measures disclosed in Non-patent Document 2 are taken in addition to hardware measures, such as ensuring robustness of an optical system.

1) Calculation of a degree of modulation: an AC component and a DC component are acquired from the received electrical signal obtained by converting the received signal light by using a filter, and a ratio (degree of modulation) of both components is calculated.

2) Stabilization of energy input to a light source: a control is made such that electrical energy input to the light source is constant.

3) Control of the light source intensity: electrical energy input to an element in order to drive a light source element is controlled such that the average time of the amount of received signal light is constant.

In principle, both measures described in 2) and 3) cannot be performed at the same time.

Non-patent Document 1: 'Analyses of basic characteristics of photocurrent transformer applying an optical heterodyne method', the Institute of Electrical Engineers of Japan, journal B. Vol. 117, No. 3, 1997 (pp. 354-363)

Non-patent Document 2: 'Technical data on optical fiber sensor: revised edition', edited by Toshihiko Yoshino, 1986 (pp. 404-405)

DISCLOSURE OF INVENTION

By taking measures described in 1) to 3), the drift fluctuation may be removed. On the other hand, the method described in 1) is useless for reducing relatively high-speed fluctuation in the amount of light which is not drift fluctuation. The reason is that AC components of an electric signal according to the fluctuation in the amount of light pass through a filter that extracts AC components from a signal, such that it is not possible to distinguish between the AC components and the signal. In particular, a main cause of fluctuation in the amount of light in terms of an alternating current includes a signal ripple input to a light source element.

Therefore, it is an object of the invention to improve measurement accuracy by preventing influences on a sensor output even in the case when there is a ripple in a light source.

In order to solve the above problems, according to a first aspect of the invention, there an intensity modulation type optical sensor is provided in which light from a light source is guided to a sensor head formed of an optical component, the intensity of the light is modulated on the basis of an alternating current (AC) measured object changing with time in the sensor head, the modulated light is received and converted into an electrical signal, a normalized received signal indicating the degree of modulation is acquired from a ratio of an AC component and a DC component of the electrical signal, and a value of the AC measured object is acquired on the basis of the normalized received signal. The intensity modulation type optical sensor is characterized in that a reference signal is acquired by separating and receiving a part of light incident on the sensor head, a normalized reference signal is acquired from a ratio of an AC component and a DC component of the reference signal, and the normalized reference signal is subtracted from the normalized received signal, thereby reducing noise.

An intensity modulation type optical current sensor may be obtained by applying a principle of the Faraday effect to the first aspect of the invention (second aspect of the invention). An intensity modulation type optical voltage sensor may be obtained by applying a principle of the Pockels effect to the first aspect of the invention (third aspect of the invention) as well.

According to the invention, noise occurring due to, for example, a ripple in a light source can be reduced. Accordingly, advantages are obtained in that it is possible not only to improve the measurement accuracy but also to easily realize an optical current sensor or an optical voltage sensor.

BEST MODE FOR CARRYING OUT THE INVENTION

Figure 1:
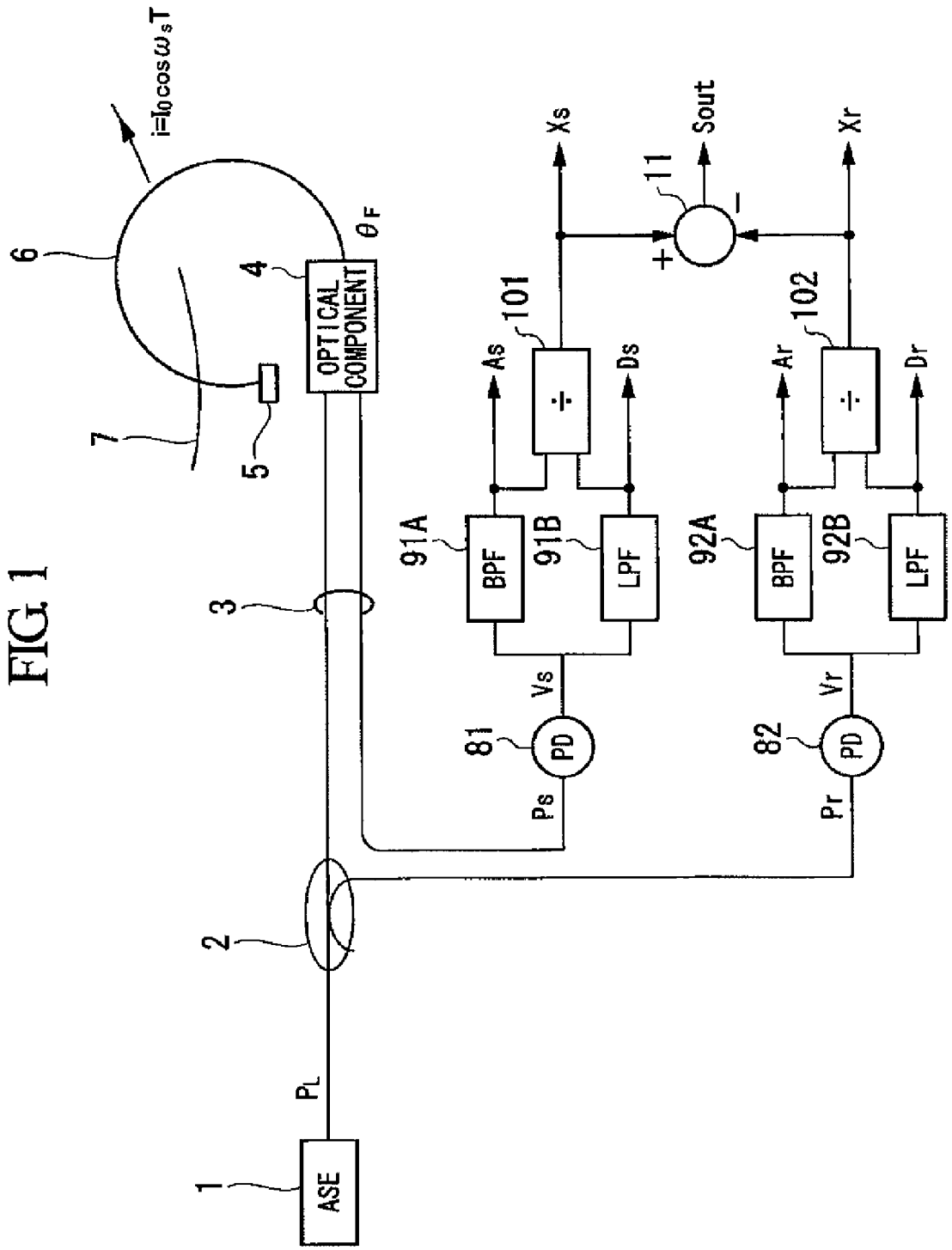
FIG. 1 is a block diagram illustrating an embodiment of the invention.

FIG. 1 is a block diagram illustrating an embodiment of the invention

In the drawing, a light source (ASE) 1, a fiber coupler 2, an optical path 3 formed of a fiber, an optical component 4 including a ferromagnetic Faraday rotator and a polarized light separating element, a mirror 5, a sensor fiber 6, and a measured conductor 7, are shown. Reference numerals 81 and 82 denote light receiving elements, such as photodiodes (PD). Reference numerals 91A and 92A denote band pass filters (BPF), reference numerals 91B and 92B denote low pass filters (LPF), and reference numerals 101 and 102 denote dividers. Reference numeral 11 denotes a subtractor.

Now, noise included in the light source 1 is modeled as a sinusoidal wave having a frequency $\omega_n$. Light $P_L$ output from the light source 1 is expressed using $\alpha$ as noise content as follows.

$$P_L = P_O(1 + \alpha \cos \omega_n t) \quad (1)$$

In addition, assuming that a Faraday rotation angle is $\theta_F$, a current flowing through a conductor is i ($i = I_O \cos \omega_s t$), and a Verdet constant is V, the Faraday rotation angle is $\theta_F$ is expressed by Expression (2) given below.

$$\theta_F = Vi = VI_O \cos \omega_s t \quad (2)$$

Assuming that an output of the light receiving element 81 is $V_S$ and a transmission and conversion efficiency is 'a', the output $V_S$ is expressed by Expression (3) given below.

$$V_S = aP_L(1 + \sin 2\theta_F) \quad (3)$$

Substituting Expressions (1) and (2) for Expression (3) and assuming that $|2\theta_F| \ll \pi/2$, $V_S$ is expressed by Expression (4) given below.

$$V_S \approx aP_O(1 + \alpha \cos \omega_n t)(1 + 2VI_O \cos \omega_s t) \quad (4)$$

Expression (5) is obtained by expanding Expression (4).

$$V_S = aP_O(1 + 2VI_O \cos \omega_s t + \alpha \cos \omega_n t + 2VI_{O\alpha \cos \omega_n} t \cdot \cos \omega_s t) \quad (5)$$

Here, assuming that $\omega_n \neq \omega_s$, a first term in Expression (5) corresponds to a DC component and terms subsequent to the first term correspond to AC components.

Then, assuming that $aP_O \rightarrow D_S$ and $aP_O(1 + 2VI_O \cos \omega_s t + \alpha \cos \omega_n t + 2VI_O\alpha \cos \omega_n t \cdot \cos \omega_s t) \rightarrow A_S$, a ratio $X_S$ of $D_S$ and $A_S$ is expressed by expression (6) given below.

$$X_S = A_S/D_S = 2VI_O \cos \omega_s t + \alpha \cos \omega_n t + 2VI_O\alpha \cos \omega_n t \cdot \cos \omega_s t \quad (6)$$

Here, the first term corresponds to a signal component and second and third terms correspond to noise components. Thus, the received signal Ps is normalized by calculating the ratio of a DC component and an AC component.

Comparing the second and third terms with each other, the effect caused by the second term is larger because $\alpha$ and $2VI_O\alpha$ are considered to be a small amount. Accordingly, in order to remove the term, reference light $P_r$ is used.

First, assuming that 'b' is a transmission and conversion efficiency, an output $V_r$ of the light receiving element 82 is expressed by Expression (7) given below.

$$V_r = bP_L = bP_O(1 + \alpha \cos \omega_n t) \quad (7)$$

In the same manner as described above, a first term corresponds to a DC component and a second term corresponds to an AC component. Accordingly, assuming that $bP_O \rightarrow D_r$ and $bP_O\alpha \cos \omega_n t \rightarrow A_r$, a ratio $X_r$ of $D_r$ and $A_r$ is expressed in by Expression (8) given below.

$$X_r = A_r/D_r = \alpha \cos \omega_n t \quad (8)$$

That is, the reference signal Pr is normalized by calculating a ratio $X_r$ of both $A_r$ and $D_r$.

If Expression (8) is subtracted from Expression (6) described above, $S_{out}$ is calculated by Expression (9) given below.

$$S_{out} X_S - X_r = 2VI_O \cos \omega_s t + 2VI_O\alpha \cos \omega_n t \cdot \cos \omega_s t \quad (9)$$

Comparing Expression (6) with Expression (9), it can be seen that a noise component corresponding to the second term of Expression (6) does not exist in Expression (9). In addition, even though a noise component corresponding to a second term still remains in Expression (9), the second term is very small. That is, since the second term of Expression (9) is $\alpha$ times the second term of Expression (6), which is very small as compared with the second term of Expression (6), the second term of Expression (9) is negligible.

That is, it is easily considered that a signal (reference signal Pr) used as reference is extracted and the signal is subtracted from a received signal Ps when a noise component is included in the received signal. At this time, the noise component cannot be removed only by simply subtracting the reference signal Pr from the received signal Ps. The reason is that time average values (signal levels) of the received signal Ps and the reference signal Pr are different, and accordingly, levels of noise components included in both the received signal and the reference signal are different.

Therefore, in the invention, a reference signal Pr is also normalized as an AC component and a DC component, the degree of modulation (normalized reference signal) of the reference signal is calculated, and the normalized reference signal is subtracted from a normalized received signal, such that noise components can be accurately removed.

Figure 2:
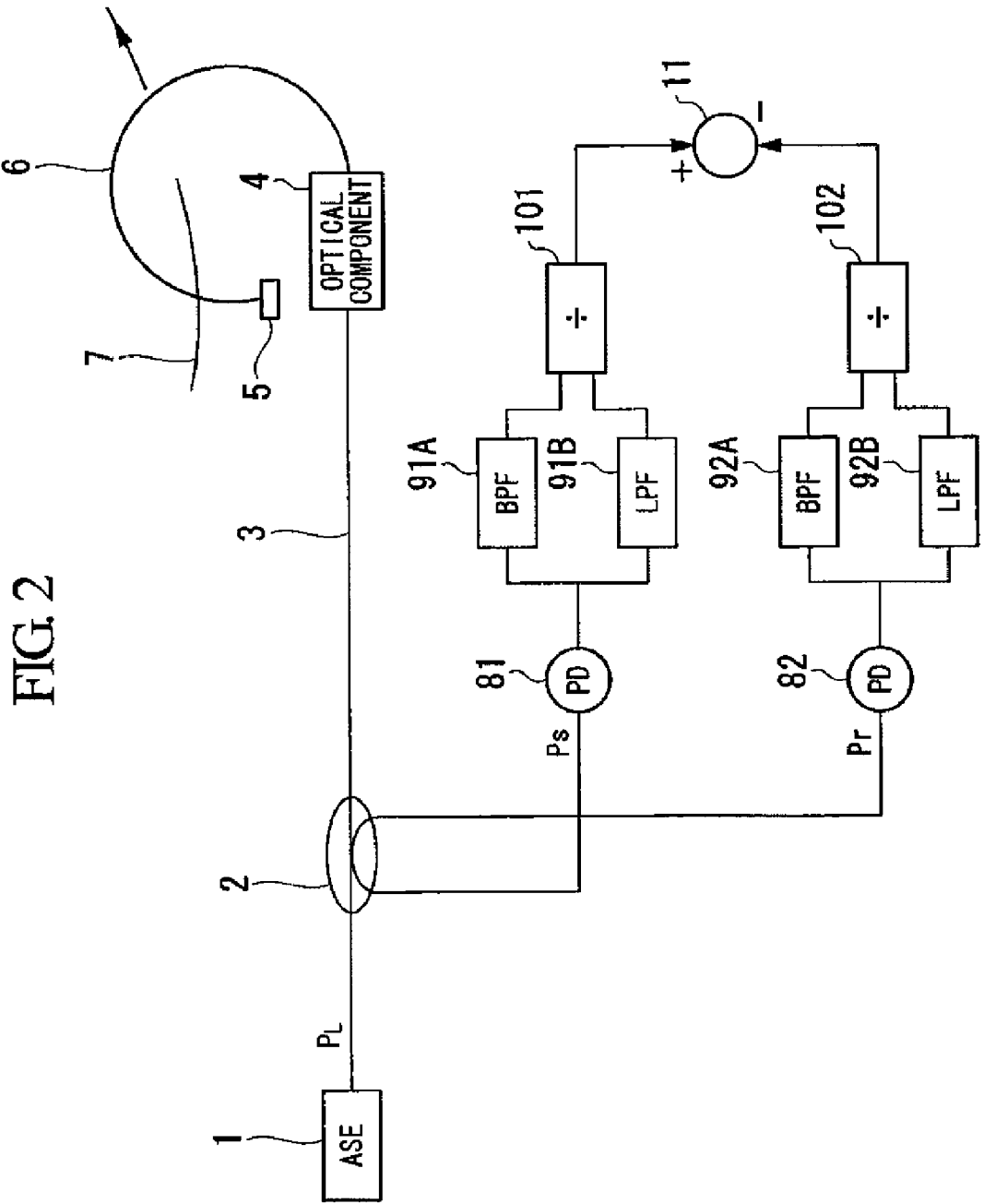
FIG. 2 is a block diagram illustrating a modified example.

FIG. 2 illustrates a modified example of FIG. 1. while only the reference signal Pr is transmitted from the fiber coupler 2 in FIG. 1, the received signal Pr is also transmitted from the fiber coupler 2 in FIG. 2 so that only one optical path 3 is used in FIG. 2. Since the others are the same as FIG. 1, a detailed explanation thereof will be omitted.

In the above, a current detection sensor that is based on the principle of modulation of light intensity using the Faraday effect has been explained. However, the invention can also be applied to a voltage detection sensor, which is based on the principle of modulation of light intensity using the Pockels effect, in the same manner as described above.

Figure 3:
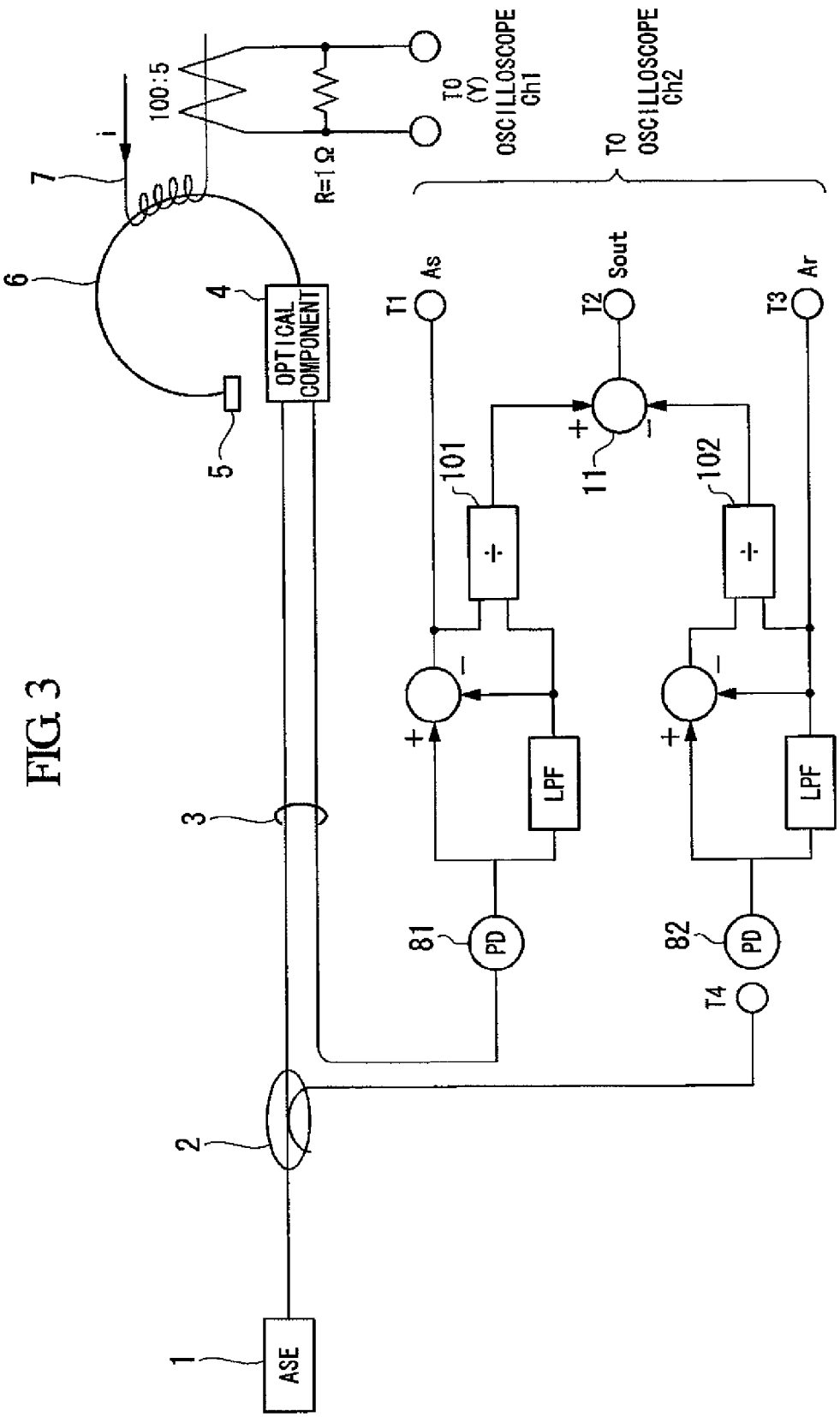
FIG. 3 is a view illustrating the configuration for verifying the invention and conducting experiments thereon.

FIG. 3 illustrates an example of the configuration for verifying the invention and conducting experiments thereon.

In this example, the same configuration as in FIG. 1 is used, and a signal waveform of each terminal is observed using an oscilloscope when an AC current i (equivalent measured current=0.35×760 (times)=266 A [rms]) having an effective value (rms) of 0.3 A, 50 Hz flows through a conductor 7. In addition, the wavelength of light from alight source 1 is 1550 nm, the amount of light attenuated in the optical fiber coupler 2 is 3 dB, a fiber 6 is wound once, and a conductor 7 is wound around the fiber 760 times.

Figure 4A:
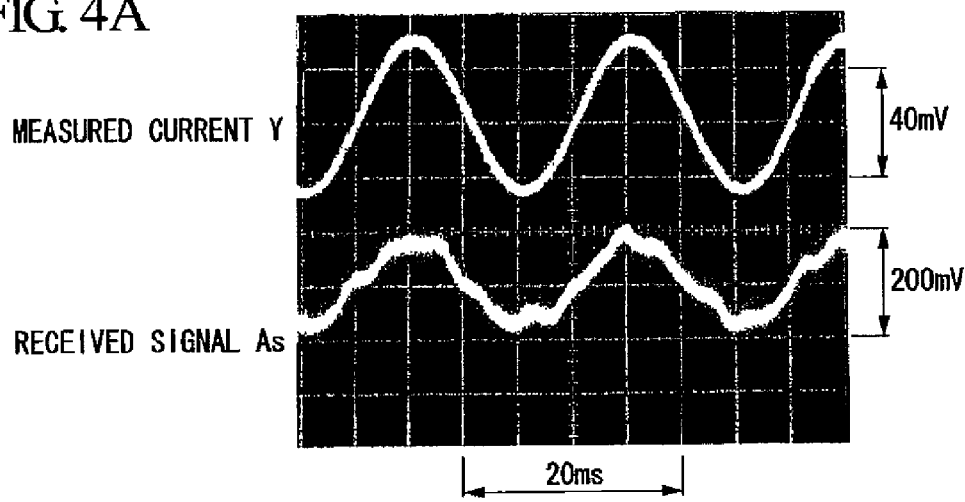
FIG. 4 is a view illustrating waveforms according to a first experimental result.
Figure 4B:
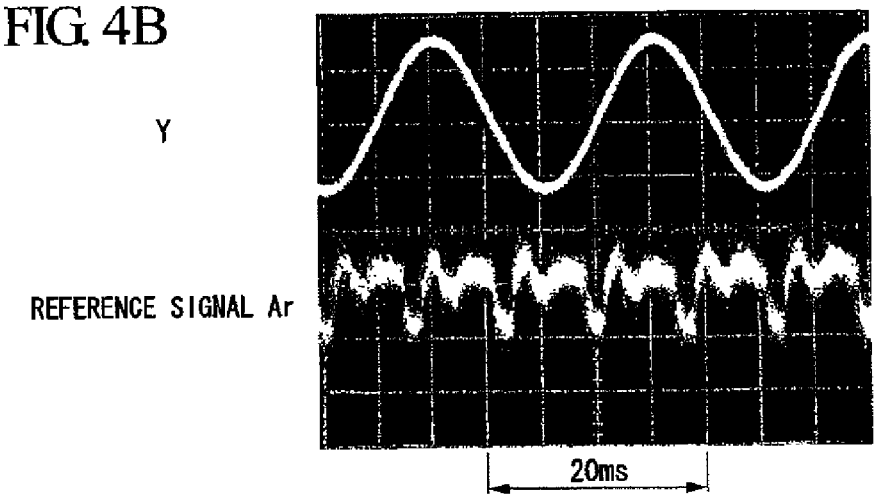
Figure 4C:
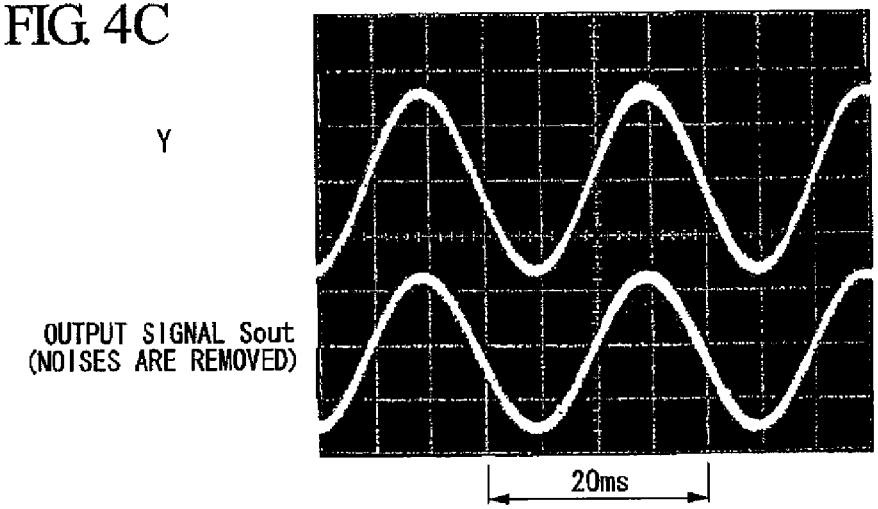
Figure 5:
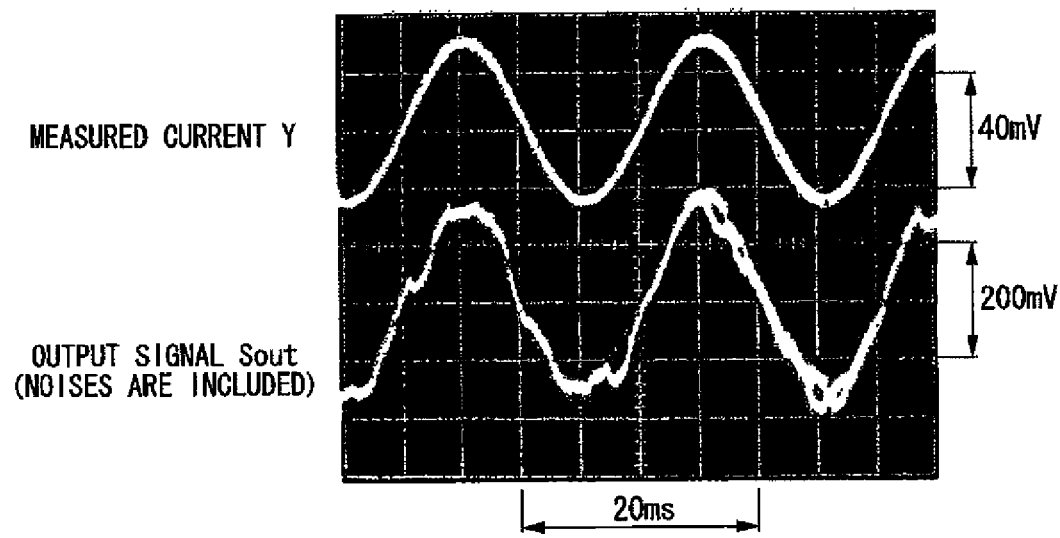
FIG. 5 is a view illustrating waveforms according to a second experimental result.

FIGS. 4 and 5 illustrate waveforms observed by using the above-mentioned oscilloscope. In addition, FIG. 4 illustrates a case in which a reference signal terminal T4 is connected in FIG. 3, and FIG. 5 illustrates a case in which the reference signal terminal T4 is not connected in FIG. 5. A measured current Y from a terminal T0 is introduced into an upper side (Ch1) of an oscilloscope screen and signals As, Ar, and $S_{out}$ from terminals T1 to T3 are introduced into a lower side (Ch2) of the oscilloscope screen, and the amounts of those described above are expressed as shown in FIGS. 4A, 4B, and 4C. In addition, a horizontal axis of the oscilloscope screen indicates a time axis of 5 msec/div, the upper side (Ch1) of a vertical axis of the oscilloscope screen indicates a voltage axis of 20 mV/div, and the lower side 5 (Ch2) of the vertical axis indicates a voltage axis of 100 mV/div.

As is apparent from comparison of the relationship between the measured current Y and the signal $S_{out}$ shown in FIG. 4C and the relationship between the measured current Y and the signal $S_{out}$ shown in FIG. 5, a waveform of the signal $S_{out}$ is distorted with respect to a waveform of the measured current Y in the case corresponding to the related ark which is shown in FIG. 5 and in which the reference signal is not used. However, in FIG. 4C of the invention in which the reference signal is used, the waveform of the signal $S_{out}$ is a sinusoidal wave, which is almost the same as the waveform of the measured current Y. Accordingly, it can be understood that noise components are reduced.

The invention claimed is:

1. An intensity modulation type optical sensor comprising:
   a sensor head including a optical component which is supplied with light from a light source and modulates a intensity of the light on the basis of an alternating current (AC) measured object changing with time;
   a first photoelectric converter which receives and converts the light modulated by the sensor head into an electric signal;
   a first divider which calculates a normalized received signal indicating a degree of modulation from a ratio of an AC component and a direct current (DC) component of the electrical signal converted by the first photoelectric converter;
   a fiber coupler which separates a part of the light before being supplied to the sensor head to obtain reference light;
   a second photoelectric converter which receives and converts the reference light into an electric signal;
   a second divider which calculates a normalized reference signal from a ratio of an AC component and a DC component of the electrical signal converted by the second photoelectric converter; and
   a subtractor which calculates a value of the AC measured object by subtracting the normalized reference signal from the normalized received signal.

2. An intensity modulation type optical sensor according to claim 1, wherein the optical component modulates the intensity of the light on the basis of the AC measured object using Faraday effect.

3. An intensity modulation type optical sensor according to claim 1, wherein the optical component modulates the intensity of the light on the basis of the AC measured object using Pockels effect.

* * * * *